(12) United States Patent  
Hwang

(10) Patent No.: US 7,824,980 B2  
(45) Date of Patent: Nov. 2, 2010

(54) SEMICONDUCTOR DEVICE AND METHOD FOR MANUFACTURING THE SAME

(75) Inventor: Mun-Sub Hwang, Yueeong-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/253,250

(22) Filed: Oct. 17, 2008

(65) Prior Publication Data

US 2009/0115000 A1  May 7, 2009

(30) Foreign Application Priority Data

Nov. 1, 2007 (KR) .................... 10-2007-0110790

(51) Int. Cl.
*H01L 21/336* (2006.01)

(52) U.S. Cl. ............... 438/260; 438/197; 257/E21.205; 257/E21.638; 257/E21.635; 257/E21.624

(58) Field of Classification Search .......... 257/E21.638, 257/E21.635, E21.624, E21.205, E29.135, 257/408, 336; 438/197, 260

See application file for complete search history.

(56) References Cited

U.S. PATENT DOCUMENTS

| | | | | |
|---|---|---|---|---|
| 6,136,675 A | * | 10/2000 | Lee | 438/585 |
| 6,200,840 B1 | * | 3/2001 | Chen et al. | 438/184 |
| 6,635,576 B1 | * | 10/2003 | Liu et al. | 438/700 |
| 2003/0008452 A1 | * | 1/2003 | Takagi | 438/218 |

* cited by examiner

*Primary Examiner*—Thanh V Pham  
*Assistant Examiner*—Maria Ligai  
(74) *Attorney, Agent, or Firm*—Sherr & Vaughn, PLLC

(57) ABSTRACT

A semiconductor device and a method for manufacturing the same includes forming a poly-gate including a first poly-gate portion and a second poly-gate portion on and/or over a semiconductor substrate, forming a trench having a predetermined depth in the poly-gate, implanting dopant ions into the entire surface of the semiconductor substrate and the poly-gate including the trench, forming a contact barrier layer to cover a portion of the poly-gate including the trench while exposing an upper surface of the remaining portion of the poly-gate on which a contact will be formed, and forming a contact on the exposed upper surface of the poly-gate.

12 Claims, 7 Drawing Sheets

- Related Art -

- Related Art -

- Related Art -

SEMICONDUCTOR DEVICE AND METHOD FOR MANUFACTURING THE SAME

The present application claims priority under 35 U.S.C. §119 to Korean Patent Application No. 10-2007-0110790 (filed on Nov. 1, 2007), which is hereby incorporated by reference in its entirety.

BACKGROUND

Figure 1A:
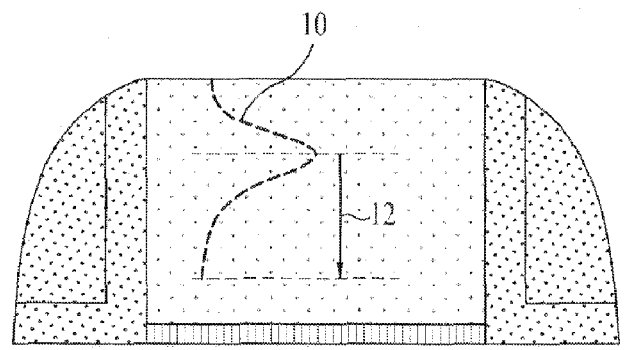

As illustrated in example FIG. 1A, a semiconductor device can include doping profile 10 in a poly-gate after ion implantation. As illustrated in example FIG. 1B, gate depletion is illustrated due to a poly-capacitance. As illustrated in example FIG. 1C, a graph illustrates voltage-capacitance characteristics of a transistor.

Currently, when a semiconductor substrate having a poly-gate formed thereon and/or thereover is subjected to ion implantation to produce a source/drain region, ions are implanted into the poly-gate as well as the semiconductor substrate, thereby forming a poly-resistor and a transistor. There is a high demand for high integration of semiconductor devices. Therefore, as can be appreciated from doping profile 10 illustrated in example FIG. 1A, due to a difference in the density of dopants in a poly-gate, a transistor gate, as illustrated in example FIG. 1B, may exhibit parasitic capacitance or poly-capacitance 14, causing gate depletion. The gate depletion can be clearly seen from a characteristic curve of capacitance C and voltage V as illustrated in example FIG. 1C. Consequently, the resulting transistor has an RC time-constant delay and a difficulty in the control of matching conditions with analogue devices. This makes it difficult to predict device performance and causes problems in circuit design.

SUMMARY

Embodiments relate to a semiconductor device such as a transistor, and more particularly, to a semiconductor device and a method for manufacturing the same that reduces gate depletion.

Embodiments relate to a semiconductor device and a method for manufacturing the same that minimizes gate depletion in a poly-gate.

Embodiments relate to a method for manufacturing a semiconductor device that may include at least one of the following steps: forming a poly-gate on and/or over a semiconductor substrate; and then forming a trench having a predetermined depth in the poly-gate; and then implanting dopant ions into the entire surface of the semiconductor substrate and the poly-gate including the trench; and then forming a contact barrier layer to cover a portion of the poly-gate including the trench while exposing an upper surface of the remaining portion of the poly-gate on and/or over which a contact will be formed; and then forming a contact on and/or over the exposed upper surface of the poly-gate.

Embodiments relate to a semiconductor device that may include at least one of the following: a poly-gate formed on and/or over a semiconductor substrate and having a trench formed to a predetermined depth, into which dopant ions are implanted; a source/drain region formed in the semiconductor substrate at opposite sides of the poly-gate; a contact barrier layer covering an upper surface of the poly-gate including the trench; and a contact formed on and/or over an exposed portion of the poly-gate not covered with the contact barrier layer.

Embodiments relate to a semiconductor device that may include at least one of the following: a semiconductor substrate; a poly-gate having a first poly-gate portion and second poly-gate portion formed over the semiconductor substrate; a trench formed at a predetermined depth in the second poly-gate portion, wherein the trench is doped with ions; a source/drain region formed in the semiconductor substrate at opposite sides of the poly-gate; a contact barrier layer formed over the second poly-gate portion including the trench while exposing an upper surface of the first poly-gate portion; and a contact formed over the exposed upper surface of the first poly-gate portion.

Embodiments relate to a semiconductor device that may include at least one of the following: a semiconductor substrate having an active region; a gate oxide layer formed in the active region; a poly-gate including a first poly-gate portion and a second poly-gate portion formed over the semiconductor substrate such that the respective uppermost surfaces of the first poly-gate portion and the second poly-gate portion are coplanar; a trench formed in the second poly-gate portion; a source/drain region formed in the semiconductor substrate at opposite sides of the poly-gate; a contact barrier layer formed over the second poly-gate portion including the trench while exposing an upper surface of the first poly-gate portion; and a contact formed over the exposed portion of the upper surface of the first poly-gate portion.

DRAWINGS

Figure 1B:
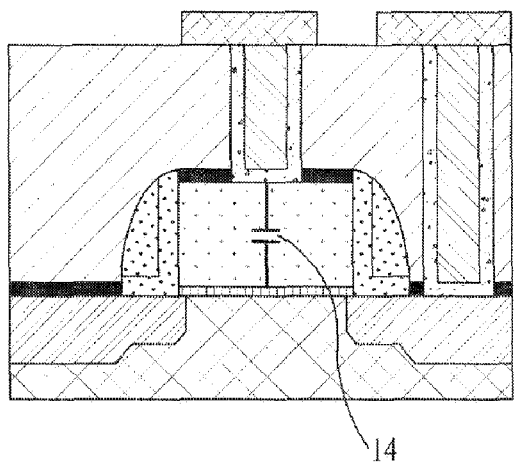
Figure 1C:
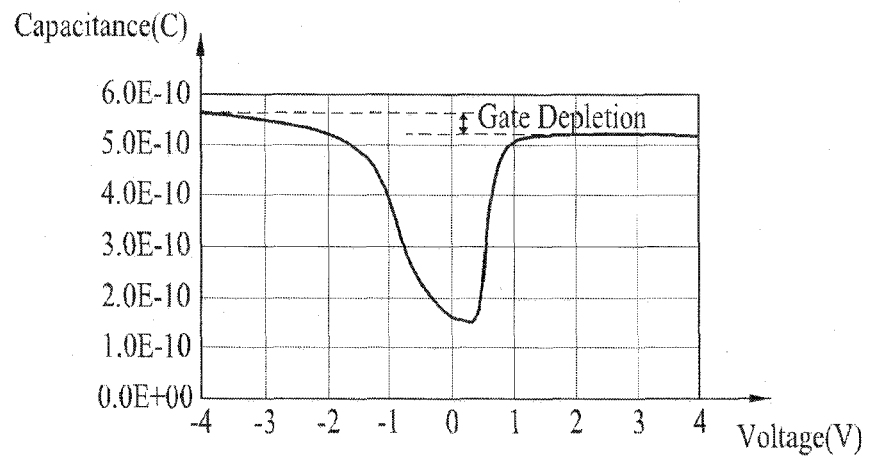

Example FIGS. 1A to 1C illustrate a semiconductor device.

Figure 2:
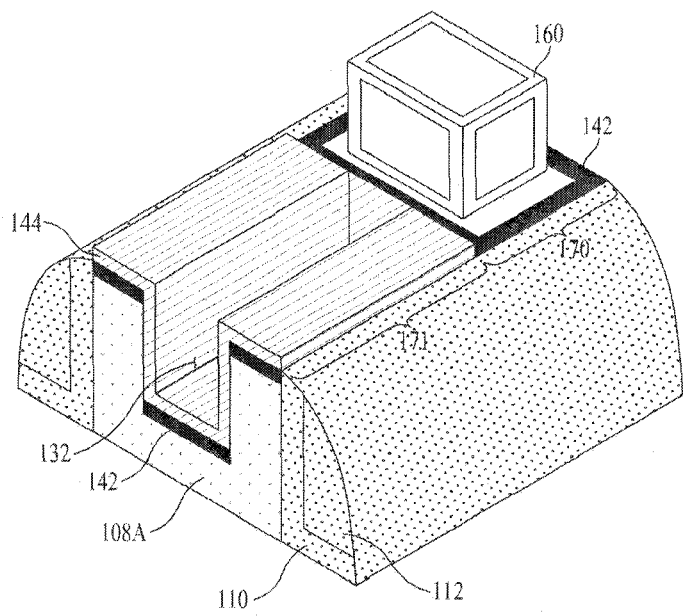

Example FIG. 2 illustrates a semiconductor device in accordance with embodiments.

Example FIGS. 3A to 3H illustrate a method for manufacturing a semiconductor device in accordance with embodiments.

Figure 4A:
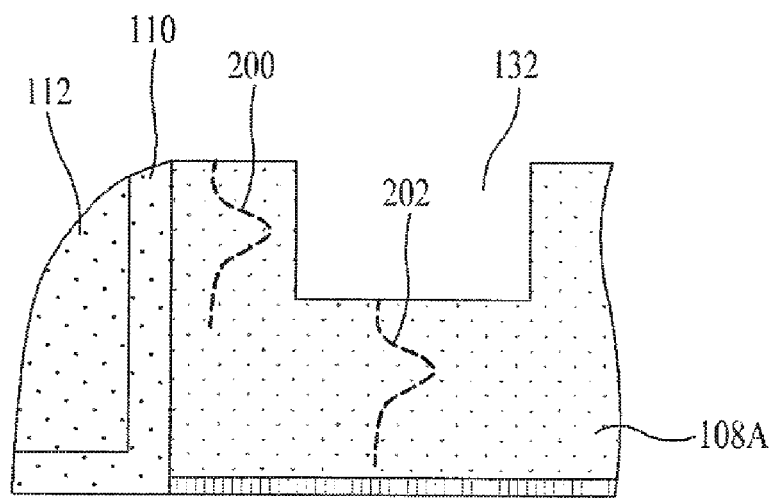
Figure 4B:
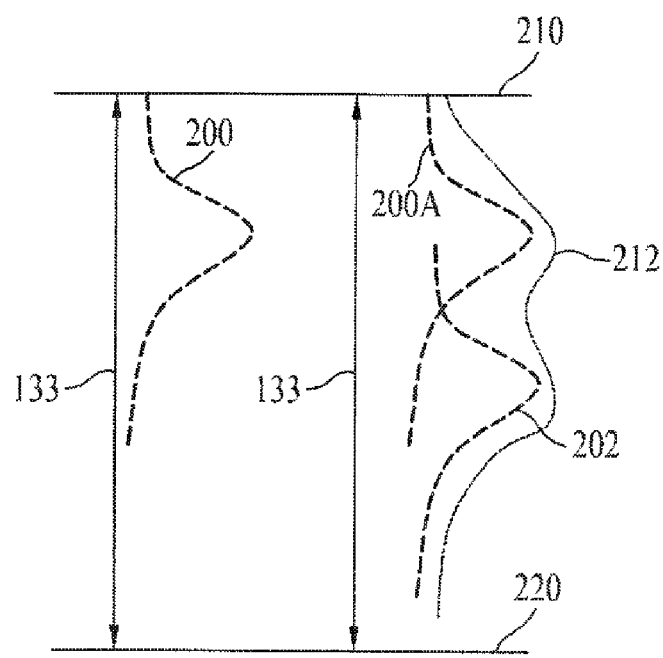

Example FIGS. 4A and 4B illustrate a comparison of a doping profile in a poly-gate and a doping profile of a poly-gate manufactured in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

As illustrated in example FIG. 2, a semiconductor device in accordance with embodiments may include poly-gate 108A, a source/drain region, spacers 110 and 112, silicide layer 142, contact barrier layer 144 and contact 160. Poly-gate 108A is formed on and/or over a semiconductor substrate, and trench 132 having a predetermined depth is formed in poly-gate 108A. Dopant ions are implanted in trench 132. More specifically, poly-gate 108A may be divided into first portion 170 on and/or over which contact 160 is formed, and second portion 171 on and/or over which contact 160 is not formed. Trench 132 is formed only in second portion 171 of poly-gate 108A on and/or over which the contact 160 is not formed. First portion 170 is formed spatially behind second portion 171 on and/or over the semiconductor substrate.

A lightly doped drain (LDD) region is provided in the semiconductor substrate on opposite sides of poly-gate 108A. A portion of the LDD region may be diffused so as to be present below poly-gate 108A. The source/drain region is formed in the semiconductor substrate at opposite sides of poly-gate 108A. If spacers 110 and 112 are formed at opposite sides of poly-gate 108A as illustrated in example FIG. 2, the source/drain region is formed in the semiconductor substrate at opposite sides of spacers 110 and 112.

Silicide layer 142 is formed on and/or over poly-gate 108A and the source/drain region. In order to protect trench 132 of poly-gate 108A when forming contact 160, second portion 171 of poly-gate 108A, in which trench 132 is located, is covered with contact barrier layer 144. First portion 170 of poly-gate 108A, on and/or over which contact 160 will be formed, is exposed to the outside rather than being covered with contact barrier layer 144.

Example FIGS. 3A to 3H are process sectional views illustrating according to the present invention.

Figure 3A:
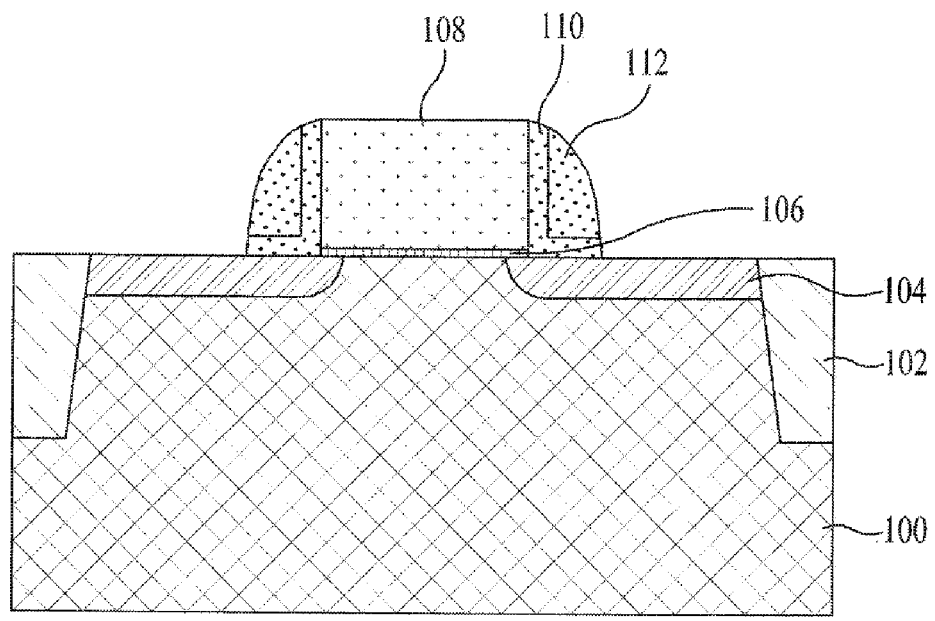

As illustrated in example FIG. 3A, a method for manufacturing a semiconductor device in accordance with embodiments may include device isolation layer 102 formed on and/or over semiconductor substrate 100, thereby defining an active region and an isolation region. Device isolation layer 102 may be formed via a shallow trench isolation (STI) process or local oxidation of silicon (LOCOS) process. Next, gate oxide layer 106 and poly-gate 108 are formed in the active region. Then, dopant ions are implanted into the surface of semiconductor substrate 100 while using poly-gate 108 as a mask, thereby forming lightly doped drain (LDD) region 104. Although poly-gate 108 is used as a mask, LDD region 104 may be diffused below poly-gate 108.

After forming LDD region 104, multi-layered spacers 110 and 112 are formed on sidewalls of gate oxide layer 106 and poly-gate 108. Spacers 110 and 112 may be formed in a single layer or a plurality of layers. For example, first and second dielectric layers 110 and 112, having different etching selectivities, are sequentially formed on and/or over the entire surface of poly-gate 108. First dielectric layer 110 may be an oxide layer and second dielectric layer 112 may be a nitride layer. The entire surface of first dielectric layer 110 and second dielectric layer 112 is subjected to an etch-back process, thereby forming spacers 110 and 112 at opposite sidewalls of poly-gate 108.

Figure 3B:
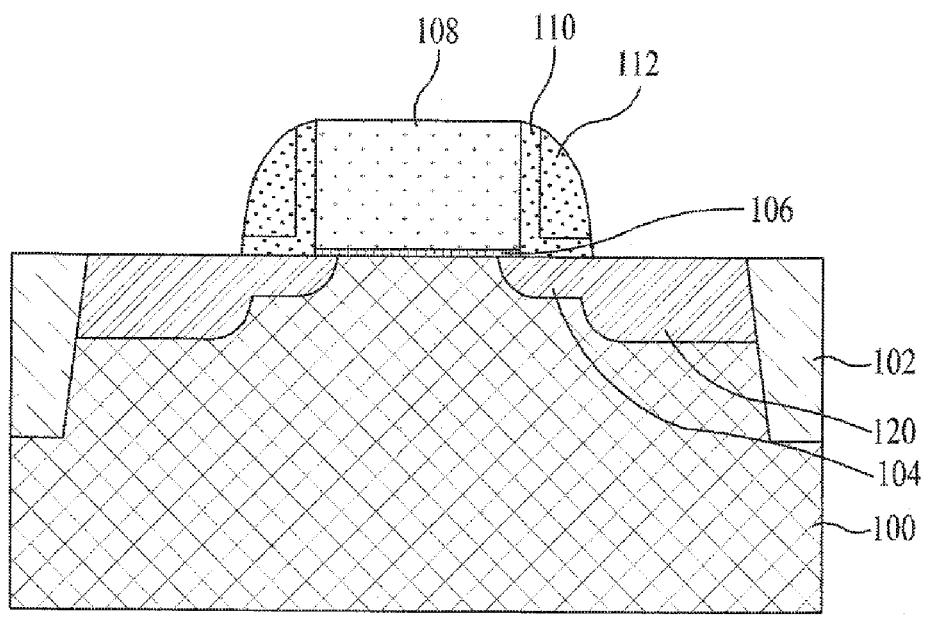

As illustrated in example FIG. 3B, high density dopant ions are implanted using poly-gate 108 and spacers 110 and 112 as masks, thereby forming source/drain region 120 in semiconductor substrate 100 connected to LDD region 104 at opposite sides of spacers 110 and 112.

Figure 3C:
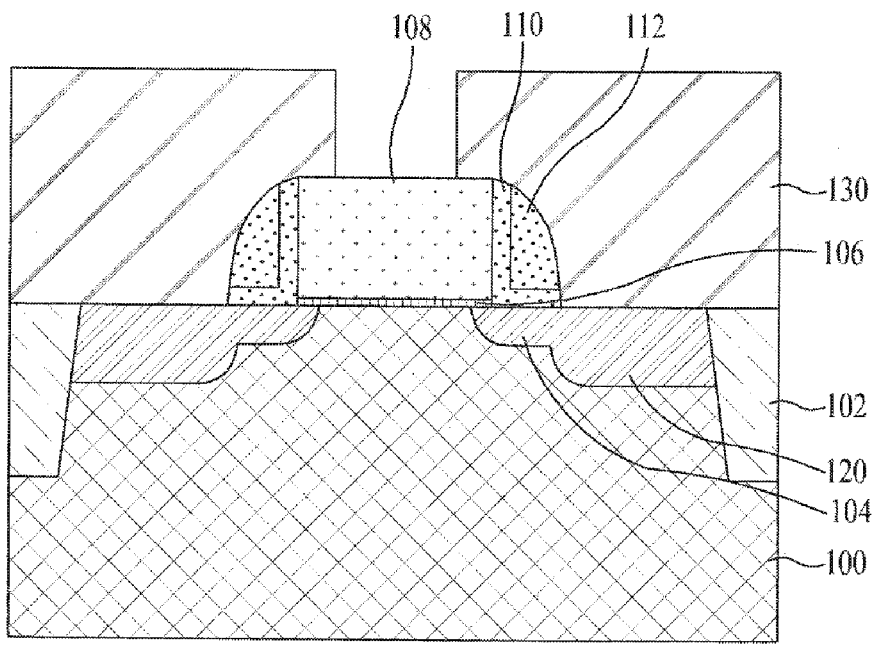
Figure 3D:
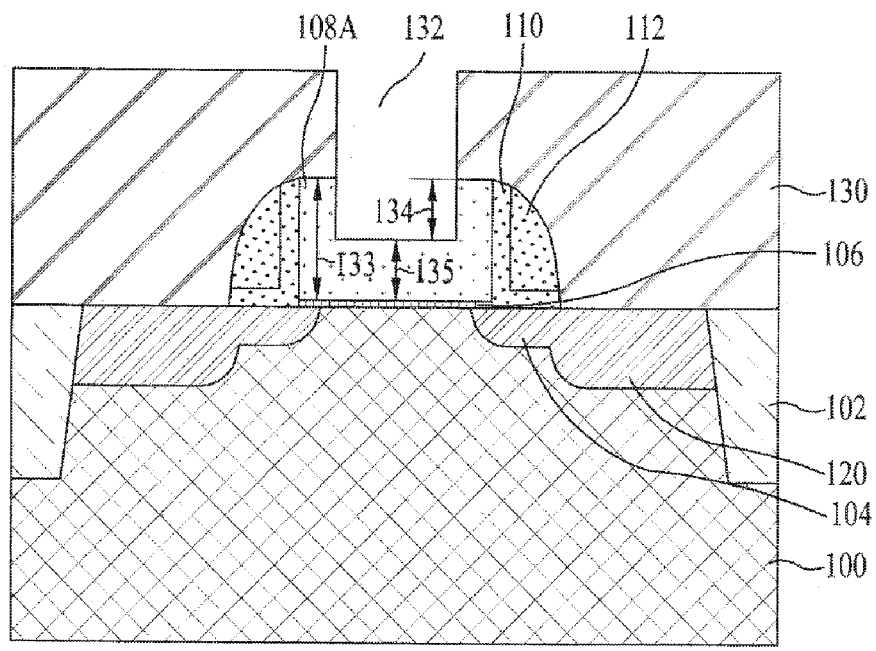

As illustrated in example FIGS. 3C and 3D, trench 132 having a predetermined depth is formed in poly-gate 108. For example, a photosensitive layer is coated on and/or over the entire surface of semiconductor substrate 100 including poly-gate 108. The coated photosensitive layer is exposed and etched using a mask, thereby forming photosensitive layer patterns 130. Photosensitive layer patterns 130 serves to expose a portion of poly-gate 108 in which trench 132 will be formed. Particularly, photosensitive layer patterns 130 are configured to expose only second portion 171 of poly-gate 108A on and/or over which contact 160 will not be formed, except for first portion 170 of poly-gate 108A on and/or over which contact 160 will be formed. As illustrated in example FIG. 3D, next, poly-gate 108 is etched using photosensitive layer patterns 130 as etching masks, thereby forming trench 132 extending through poly-gate 108. After forming trench 132, photosensitive layer patterns 130 are removed.

Figure 3E:
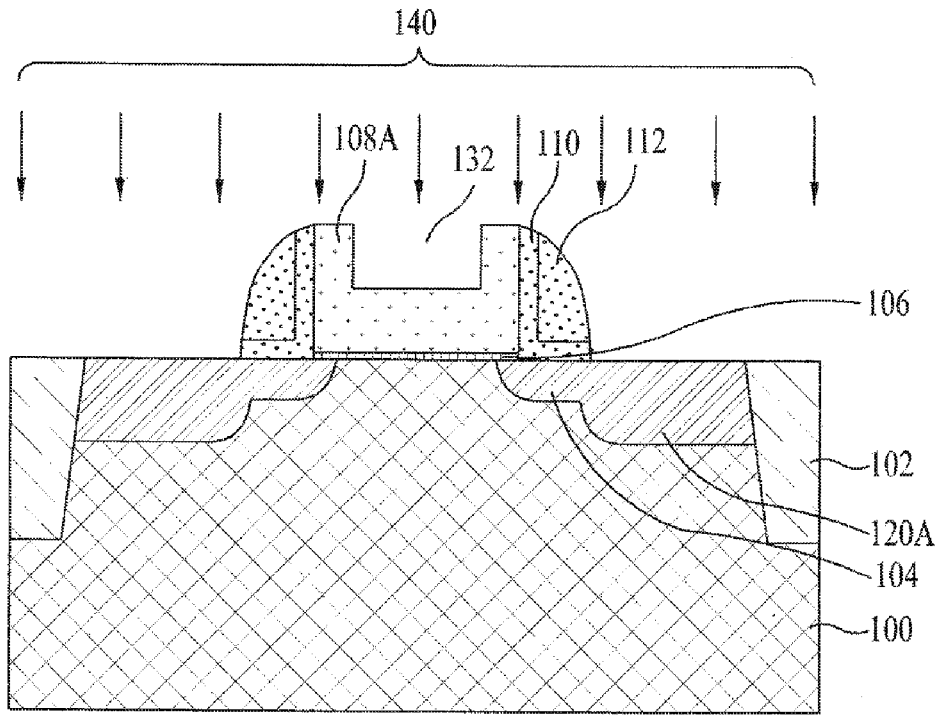

As illustrated in example FIG. 3E, dopant ions 140 are implanted into the entire surface of semiconductor substrate 100 including poly-gate 108A and trench 132. As dopant ions 140 are implanted into poly-gate 108A including trench 132, a deeper source/drain region 120A may be formed. In accordance with embodiments, prior to forming trench 132 as described above, high density dopant ions may be implanted so as to primarily form source/drain region 120 as illustrated in example FIG. 3B and thereafter, high density dopant ions are further implanted so as to secondarily form source/drain region 120A as illustrated in example FIG. 3E. Alternatively, in accordance with embodiments, the operation of forming source/drain region 120 illustrated in example FIG. 3B may be omitted. In this case, after forming trench 132 in a state where no source/drain region is present, a source/drain region may be formed when high density dopant ions 140 are implanted as illustrated in example FIG. 3E. In accordance with embodiments, one of an energy level for implantation of dopant ions 140 and the type of dopant ions 140 may be determined according to depth 134 of trench 132 to be formed. Alternatively, both the energy level for implantation of dopant ions 140 and the type of dopant ions 140 may be determined according to depth 134 to be formed. For example, the type of dopant ions 140, the energy level for implantation of dopant ions 140, depth 134 of trench 132 (D1), height 133 of the poly-gate 108A (D2), and a distance 135 from the bottom of the trench 132 to the gate oxide layer 106 (D3) may have the following relationship as represented in Table 1.

TABLE 1

| TYPE OF DOPANT ION | ENERGY LEVEL (Kev) | D2 | D3 $3R_p + 6\sigma$ | D1 |
|---|---|---|---|---|
| Phosphorus (P) | 10 | 2100 | 1188 | 912 |
| | | 2000 | 1188 | 812 |
| | | 1840 | 1188 | 652 |
| | | 1600 | 1188 | 412 |
| | 15 | 2100 | 1273 | 827 |
| | | 2000 | 1273 | 727 |
| | | 1840 | 1273 | 567 |
| | | 1600 | 1273 | 327 |
| Boron (B) | 5 | 2100 | 1215 | 885 |
| | | 2000 | 1215 | 785 |
| | | 1840 | 1215 | 625 |
| | | 1600 | 1215 | 385 |
| | 10 | 2100 | 1923 | 177 |
| | | 2000 | 1923 | 77 |
| | | 1840 | 1923 | — |
| | | 1600 | 1923 | — |
| Antimony (Sb) | 5 | 2100 | 549 | 1551 |
| | | 2000 | 549 | 1451 |
| | | 1840 | 549 | 1291 |
| | | 1600 | 549 | 1051 |
| | 10 | 2100 | 813 | 1287 |
| | | 2000 | 813 | 1187 |
| | | 1840 | 813 | 1027 |
| | | 1600 | 813 | 787 |
| | 20 | 2100 | 1230 | 870 |
| | | 2000 | 1230 | 770 |
| | | 1840 | 1230 | 610 |
| | | 1600 | 1230 | 370 |

In Table 1, "$R_p$" represents an implantation depth of dopant ions into poly-gate 108A, and "$\sigma$" represents a standard deviation. Also, the unit of energy level is KeV, and the above-mentioned depth, height, and distance are given in units of Å. In addition, depth 134 to be formed may be determined in consideration of the implantation depth of dopant ions into poly-gate 108A. A resistance of poly-gate 108A can be adjusted using depth 134 to be formed.

Figure 3F:
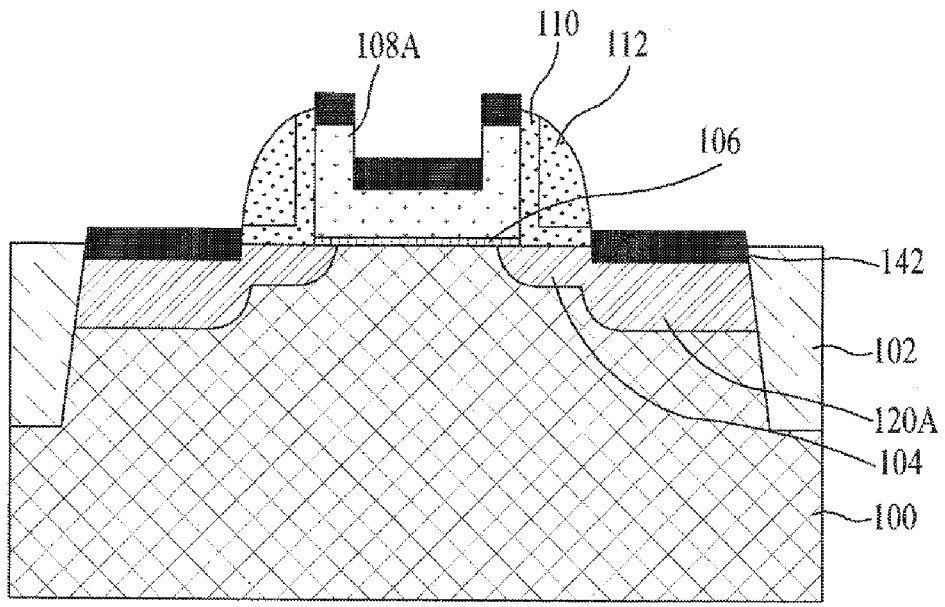

As illustrated in example FIG. 3F, silicide layer 142 may be formed on and/or over the entire surface of source/drain region 120A and poly-gate 108A including trench 132. For example, after implanting dopant ions 140, a metal layer is uniformly formed on and/or over the entire surface of semiconductor substrate 100 and poly-gate 108A, and then, semiconductor substrate 100, on and/or over which the metal layer is formed, is subjected to thermal treatment. In this case, the thermal treatment may be performed for about 30 seconds at a temperature in a range between approximately 450° C. to 550° C. During the thermal treatment, the metal layer, formed on and/or over poly-gate 108A and source/drain region 120A, undergoes a salicidation reaction, thereby forming silicide layer 142. The remaining metal layer, having not undergone salicidation, is removed by use of, for example, HF solution. Thereby, silicide layer 142 is formed on and/or over source/drain region 120A and poly-gate 108A including trench 132. Silicide layer 142 may be made of one of combinations of Tco, Ti, TiN and combinations thereof. Thereafter, to stabilize silicide layer 142 so as to achieve a lower resistance, semiconductor substrate 100, on and/or over which silicide layer 142 is formed, may be further subjected to thermal treatment for about 45 seconds at a temperature in a range between approximately 800° C. to 850° C.

Figure 3G:
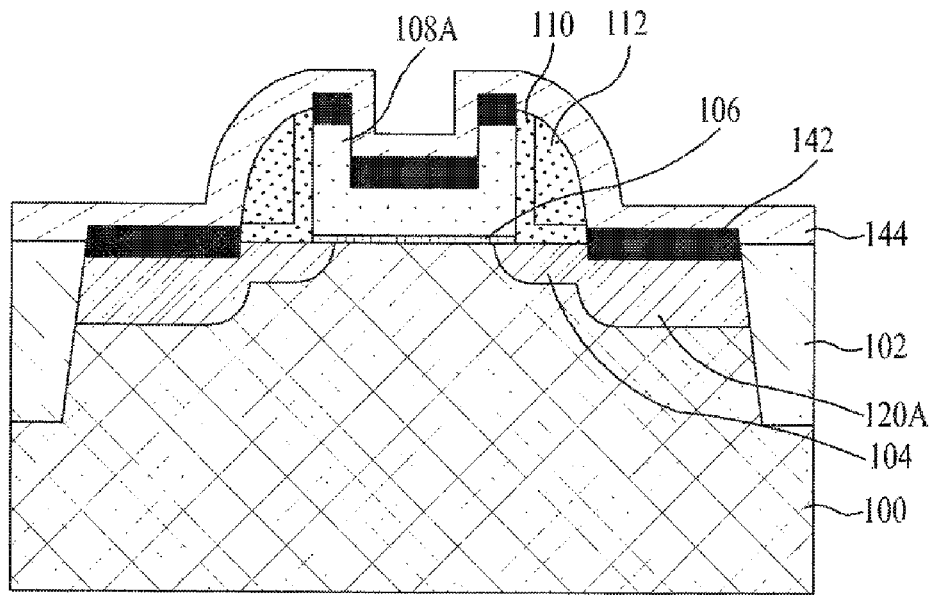

As illustrated in example FIGS. 2 and 3G, first portion 170 of poly-gate 108A, on and/or over which contact 160 will be formed, is exposed, and second portion 171 of poly-gate 108A, including trench 132, is covered with contact barrier layer 144. Contact barrier layer 144 serves to prevent second portion 171 of poly-gate 108A, in which trench 132 is formed, from being attacked during formation of contact 160.

Figure 3H:
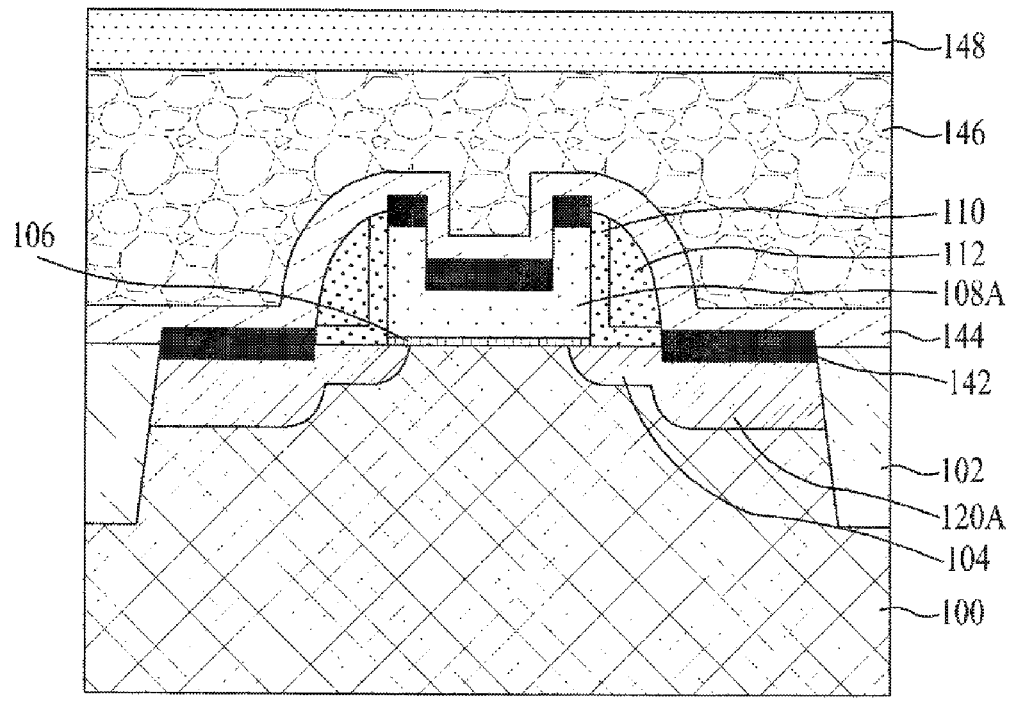

As illustrated in example FIG. 3H, to prevent short-circuiting and to maximize chemical mechanical polishing (CMP) characteristics, an inter-metal dielectric (IMD) is appropriately coated on and/or over contact barrier layer 144, forming inter-dielectric layer 146. Thereafter, to prepare a pattern for forming metal contacts and metal wirings on and/or over poly-gate 108A, source/drain region 120A and an additional capacitor, photosensitive layer 148 is coated on and/or over inter-dielectric layer 146 to form a photosensitive layer pattern using a mask. After gap-filling a metal such as tungsten (W) using the photosensitive layer pattern, metal is deposited, so as to form contact 160 on and/or over an upper surface of first portion 170 of poly-gate 108A as illustrated in example FIG. 2. Any known process for forming contact 160 on and/or over portion 170 of poly-gate 108A using inter-dielectric layer 146 and photosensitive layer 148 may be used, and thus, a detailed description thereof will be omitted herein.

Example FIGS. 4A and 4B are views comparing a doping profile of a poly-gate and a doping profile manufactured in accordance with embodiments. Reference numeral 210 represents an uppermost surface (TOP) of the poly-gate and reference numeral 220 represents a lowermost surface (BOTTOM) of the poly-gate.

As illustrated in example FIG. 4A, when compared with doping profile 200 of a poly-gate in which a trench is not formed, it can be appreciated that doping profile 202 of poly-gate 108A, in which trench 132 is formed, is displaced closer to the bottom of poly-gate 108A. Accordingly, as illustrated in example FIG. 4A, it can be appreciated that an overall doping profile 212 of poly-gate 108A is a composition of doping profile 200A either left or right of trench 132 and doping profile 202 below trench 132, and is more gentle than doping profile 200 of the other poly-gate.

As apparent from the above description, a semiconductor device and a method for manufacturing the same in accordance with embodiments, in order to maximally restrict the occurrence of poly-capacitance due to a reduced size of a semiconductor device, more particularly, due to a shortened length of a gate, a trench is formed in a poly-gate, achieving a more even distribution of dopants in the poly-gate as compared to other poly-gates. The even distribution of dopants has advantages of minimizing the occurrence of parasitic capacitance and stabilizing characteristics of a transistor, such as gate depletion, matching conditions with analogue devices, and the like. Further, by reducing a capacitance value causing a time constant delay, a faster device operating speed and more easy prediction and stabilization of device performance can be accomplished. Accordingly, matching conditions with analogue devices can be more easily controlled, resulting in simplified circuit design. In addition, a resistance value of a poly-resistor pattern can be controlled according to a depth of the trench formed in the poly-gate.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device comprising:
   forming a poly-gate having a first poly-gate portion and a second poly-gate portion over a semiconductor substrate; and then
   forming a photosensitive layer over the entire surface of the semiconductor substrate including the second poly-gate portion; and then
   forming photosensitive layer patterns to expose only the second poly-gate portion; and then
   forming a trench at a predetermined depth in the second poly-gate portion bar etching the poly-gate using the photosensitive layer patterns as etching masks; and then
   removing the photosensitive layer patterns; and then
   implanting dopant ions into the entire surface of the semiconductor substrate and the poly-gate including the trench; and then
   forming a contact barrier layer over the second poly-gate portion including the trench while exposing an upper surface of the first poly-gate portion; and then
   forming a contact over the exposed upper surface of the first poly-gate portion.

2. The method of claim 1, further comprising:
   forming a lightly doped drain region by implanting ions into the surface of the semiconductor substrate using the poly-gate as a mask; and then
   forming a spacer at opposite sidewalls of the poly-gate; and then
   forming a silicide layer over the entire surface of the poly-gate including the trench.

3. The method of claim 2, further comprising, before forming the trench:
   forming a source/drain region in the semiconductor substrate at opposite sides of the spacer by implanting dopant ions using the poly-gate as a mask.

4. The method of claim 3, wherein the type of dopant ions used during forming the source/drain region is determined according to the predetermined depth of the trench.

5. The method of claim 1, further comprising, before forming the trench:
   forming a source/drain region in the semiconductor substrate at opposite sides of the poly-gate by implanting dopant ions using the poly-gate as a mask.

6. The method of claim 1, wherein an energy level for implantation of dopant ions is determined according to the predetermined depth of the trench.

7. The method of claim 1, wherein an energy level for implantation of dopant ions and the type of dopant ions are determined according to the predetermined depth of the trench.

8. The method of claim 1, wherein the predetermined depth of the trench is determined according to an implantation depth of dopant ions.

9. The method of claim 1, wherein the predetermined depth of the trench is determined according to a resistance of the poly-gate.

10. The method of claim 1, wherein implanting dopant ions comprises implanting ions of one of phosphorus, boron and antimony ions.

11. A method for manufacturing a semiconductor device comprising:
   forming a poly-gate having a first poly-gate portion and a second poly-gate portion over a semiconductor substrate; and then
   forming a lightly doped drain region by implanting ions into the surface of the semiconductor substrate using the poly-gate as a mask; and then
   forming a spacer at opposite sidewalls of the poly-gate; and then
   forming a source/drain region in the semiconductor substrate at opposite sides of the spacer by implanting dopant ions using the poly-gate as a mask,
   forming a trench at a predetermined depth in the second poly-gate portion; and then
   implanting dopant ions into the entire surface of the semiconductor substrate and the poly-gate including the trench; and then
   forming a silicide layer over the entire surface of the poly-gate including the trench; and then
   forming a contact barrier layer over the second poly-gate portion including the trench while exposing an upper surface of the first poly-gate portion; and then
   forming a contact over the exposed upper surface of the first poly-gate portion,
   wherein the type of dopant ions used during forming the source/drain region is determined according to the predetermined depth of the trench.

12. A method for manufacturing a semiconductor device comprising:
   forming a poly-gate having a first poly-gate portion and a second poly-gate portion over a semiconductor substrate; and then
   forming a trench at a predetermined depth in the second poly-gate portion; and then
   implanting dopant ions into the entire surface of the semiconductor substrate and the poly-gate including the trench; and then
   forming a contact barrier layer over the second poly-gate portion including the trench while exposing an upper surface of the first poly-gate portion; and then
   forming a contact over the exposed upper surface of the first poly-gate portion,
   wherein the predetermined depth of the trench is determined according to an implantation depth of dopant ions.

* * * * *